US009019666B2

(12) United States Patent
Bourgeat et al.

(10) Patent No.: US 9,019,666 B2
(45) Date of Patent: Apr. 28, 2015

(54) ELECTRONIC DEVICE, IN PARTICULAR FOR PROTECTION AGAINST ELECTROSTATIC DISCHARGES, AND METHOD FOR PROTECTING A COMPONENT AGAINST ELECTROSTATIC DISCHARGES

(75) Inventors: Johan Bourgeat, St Pierre d'Allevard (FR); Christophe Entringer, Brignoud (FR); Philippe Galy, Le Trouvet (FR); Jean Jimenez, Saint Théoffrey (FR)

(73) Assignee: STMicroelectronics S.A., Montrouge (FR)

( * ) Notice: Subject to any disclaimer, the term of this patent is extended or adjusted under 35 U.S.C. 154(b) by 381 days.

(21) Appl. No.: 13/574,497

(22) PCT Filed: Jan. 20, 2011

(86) PCT No.: PCT/EP2011/050740
§ 371 (c)(1),
(2), (4) Date: Feb. 19, 2013

(87) PCT Pub. No.: WO2011/089179
PCT Pub. Date: Jul. 28, 2011

(65) Prior Publication Data
US 2013/0141824 A1 Jun. 6, 2013

(30) Foreign Application Priority Data

Jan. 22, 2010 (FR) ...................... 10 50426
Jun. 3, 2010 (FR) ...................... 10 54363

(51) Int. Cl.
*H02H 9/00* (2006.01)
*H02H 9/04* (2006.01)
*H01L 23/60* (2006.01)
*H01L 27/02* (2006.01)

(52) U.S. Cl.
CPC ............. *H02H 9/044* (2013.01); *H01L 23/60* (2013.01); *H01L 27/0274* (2013.01); *H01L 27/0277* (2013.01); *H01L 2924/0002* (2013.01)

(58) Field of Classification Search
CPC ................................. H02H 9/04; H01L 23/60
See application file for complete search history.

(56) References Cited

U.S. PATENT DOCUMENTS 5,615,073 A 3/1997 Fried et al.
5,811,857 A 9/1998 Assaderaghi et al.
(Continued)

FOREIGN PATENT DOCUMENTS

FR 2 784 503 A1 4/2000
WO WO 2010/031798 3/2010

OTHER PUBLICATIONS

Galy, PH., et al., "Ideal Gummel Curves Simulation of High Current Gain Vertical NPN BIMOS Transistor," International Journal of Electronics, 1996, pp. 717-726, vol. 80, No. 6. Taylor & Francis, Ltd., London.

*Primary Examiner* — Jared Fureman
*Assistant Examiner* — Terrence Willoughby
(74) *Attorney, Agent, or Firm* — Slater & Matsil, L.L.P.

(57) ABSTRACT

The electronic device includes a first (BP) and a second (BN) terminal and electronic means coupled between said two terminals; the electronic means include at least one block (BLC) comprising an MOS transistor (TR) including a parasitic bipolar transistor, the MOS transistor having the drain (D) thereof coupled to the first terminal (BP), the source (S) thereof coupled to the second terminal (BN) and being additionally configured, in the event of a current pulse (IMP) between the two terminals, to operate in a hybrid mode including MOS operation in a subthreshold mode and operation of the parasitic bipolar transistor. The device can comprise two blocks (BLC1, BLC2) connected symmetrically between the two terminals (BP, BN) with a triac (TRC) the trigger of which is connected to the common terminal (BC) of the two blocks.

39 Claims, 16 Drawing Sheets

(56) References Cited

U.S. PATENT DOCUMENTS

Figure 1:
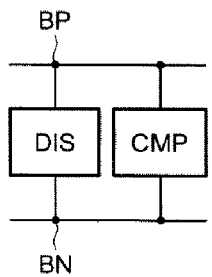

| | | |
|---|---|---|
| 6,118,154 A | 9/2000 | Yamaguchi et al. |
| 6,424,013 B1 | 7/2002 | Steinhoff et al. |
| 6,750,517 B1 | 6/2004 | Ker et al. |
| 2002/0159208 A1 | 10/2002 | Ker et al. |
| 2003/0011949 A1 | 1/2003 | Ker et al. |
| 2008/0259511 A1 | 10/2008 | Worley |
| 2009/0040668 A1 | 2/2009 | Chen et al. |
| 2010/0001347 A1 | 1/2010 | Sugiura |

ELECTRONIC DEVICE, IN PARTICULAR FOR PROTECTION AGAINST ELECTROSTATIC DISCHARGES, AND METHOD FOR PROTECTING A COMPONENT AGAINST ELECTROSTATIC DISCHARGES

This application is a national stage filing under 37 U.S.C. §371 of International Application Serial No. PCT/EP 2011/050740, filed on Jan. 20, 2011, which claims priority to French Application Serial No. 1054363, filed Jun. 3, 2010, and to French Application Serial No. 1050426, filed Jan. 22, 2010, which applications are incorporated herein by reference.

The invention relates to electronic devices, and in particular those intended for the protection of components against electrostatic discharges (ESD), but also devices of the "trigger" type (trigger being a term commonly used by those skilled in the art) capable of delivering an electrical voltage intended, for example, to control another system.

The use of advanced CMOS technologies, for example the use of technologies below or equal to 65 nanometres, and in particular the 45 or 32 nanometre technologies, is leading to the use of increasingly low power supply voltages.

According to one embodiment, there is consequently proposed an electronic device, in particular intended for protection against electrostatic discharges, capable of triggering, at very low voltages, so as in particular to limit to a low value the overvoltage at the terminals of the component to be protected.

According to another embodiment, there is proposed an electronic device capable of acting as a trigger and of delivering a control voltage that is also very low.

According to one aspect, there is proposed an electronic device, comprising a first and a second terminal and electronic means coupled between the two terminals, these electronic means comprising at least one block comprising an MOS transistor that includes a parasitic bipolar transistor, the MOS transistor having a first electrode, for example its drain, coupled to the first terminal, its second electrode, for example its source, coupled to the second terminal and also being configured to, in the presence of a current pulse between the two terminals, resulting for example from an electrostatic discharge, operate in a hybrid mode including an MOS-type operation in a below-threshold mode and an operation of the parasitic bipolar transistor.

The principle of hybrid operation of an MOS transistor has been highlighted in the article by Ph. Galy and V. Berland entitled "Ideal Gummel curves simulation of high current gain vertical NPN BIMOS transistor", INT. J. ELECTRONICS, 1996, vol. 80 No. 6,717-726. This article is a theoretical study made on a vertical-structure transistor that has a gate length (channel length) of around a micron and validated by simulations, without any application of such a hybrid operation being mentioned.

A tetrapod microelectronic component combining the bipolar effect and the MOS effect in a hybrid operating mode so as to improve the current gain has also been described in the French patent application No. 2 784 503. Such a component is presented as being resistant to ionizing radiations and it is generally stated that it can be employed for general consumer, space and/or military applications, in both digital and analogue domains, without any application of the hybrid operation of the component being mentioned.

The inventors have observed that it was particularly advantageous to use this principle of hybrid operation of the transistor in particular to produce a device subjected to a current pulse, in particular a device for protecting a component against the electrostatic discharges that are reflected in current pulses between the two terminals of the device because of a pulsed voltage difference between these two terminals.

This hybrid operation is obtained when the transistor is configured so that the gate of the MOS transistor is biased with a voltage lower than its threshold voltage and so that the substrate-source voltage difference of the MOS transistor is positive. This positive voltage difference is, for example, obtained when the substrate of the MOS transistor, which forms the intrinsic base of the parasitic bipolar transistor, is biased with a non-zero voltage while the source of the MOS transistor is linked to ground.

Inasmuch as the configuration conditions of the transistor are implemented to obtain this hybrid operation, the latter can appear for relatively long gate lengths, for example 1 micron, but, however, in this case with little significant industrial use.

However, with the evolution of the technologies, the base of the parasitic bipolar transistor is reduced, which is the case in particular for the technologies below or equal to 65 nanometres, and more particularly for the technologies below 50 nanometres, for example the 45 nanometre and 32 nanometre technologies, conferring a greater importance on the parasitic bipolar behaviour of the MOS transistor.

It then becomes possible to have the MOS transistor operate significantly, at least transiently at the start of the current pulse, below its threshold voltage and, simultaneously, to have the parasitic bipolar transistor operate.

Also, in such a hybrid operation, the current gain of the bipolar transistor, controlled by the gate voltage of the MOS transistor, may become significant up to several decades.

Thus, this hybrid operation enables such a device to be used for protection against electrostatic discharges with triggering for very low voltages, for example, in some cases, of the order of a volt, or even to be used in a trigger-type device that is capable of supplying a very low control voltage, for example of around a few tenths of a volt.

In practice, since the current gain Ic/Ib of the bipolar transistor becomes very great when the non-zero gate voltage remains less than the threshold voltage of the MOS transistor, the current passing through the transistor will, in the presence of an ESD-type pulse, very rapidly reach significant values, corresponding to the above-mentioned triggering threshold, while limiting, after this triggering, the voltage at the terminals of the component to be protected to low values, for example of the order of a volt.

This hybrid operation of the transistor thus makes it possible to have a faster triggering than that obtained with a conventional ESD protection circuit that uses, for example, an NMOS transistor, the gate of which is directly connected to ground (gate grounded NMOS) and the substrate of which is also directly connected to ground.

Obviously, if, during the pulse, the gate-source voltage of the MOS transistor becomes greater than the threshold voltage of this transistor, the MOS transistor switches from the hybrid operating mode to an MOS-type operating mode.

A number of embodiments are possible for the electronic means coupled between the two terminals of the device.

Thus, it is possible to leave the substrate and the gate of the MOS transistor floating, or else to connect them together without the gate being directly connected to ground and without the substrate being directly connected to ground. Two nodes are said to be "directly connected" or "directly coupled" when the connection or the coupling between these two nodes is produced with no intermediate component connected or coupled between these two nodes.

In practice, in this case, the gate and substrate biases required to have a hybrid operation are obtained in the presence of the current pulse through the drain-substrate and drain-gate capacitances.

More specifically, for CMOS technologies less than 1 micron, for example 250 nanometres, and even more significantly for technologies less than 65 nanometres, for example 45 nanometres, an MOS transistor that has its substrate and its gate floating or else connected together without the gate being directly connected to ground and without the substrate being directly connected to ground, will switch at least transiently to its hybrid operating mode in the presence of a current pulse resulting from an electrostatic discharge.

Such embodiments present the advantage of offering bidirectional or reversible electronic means, that is to say capable of reacting in a symmetrical manner to positive or negative current pulses. These embodiments apply more particularly but not exclusively to transistors that have thick gate oxides, for example of around 50 Angströms.

That being the case, such embodiments exhibit an extremely low triggering threshold, which may be a problem for certain applications. In practice, even though the device is effective for ESD protection, it may then be triggered accidentally in the presence of an accidental current spike in the operation of the component to be protected that is powered between a voltage Vdd and ground for example, that is to say in steady-state operation.

This triggering threshold can then advantageously be controlled by a control circuit, comprising, for example, at least one resistor, which will help to control the value of the voltage applied to the substrate and/or the gate of the transistor.

More specifically, according to one embodiment, it is also possible for the block to also comprise a control circuit configured to, in the presence of a current pulse between the two terminals, apply a non-zero first voltage to the substrate of the MOS transistor and a second voltage lower than the threshold voltage to the gate of the MOS transistor.

This control device is advantageously configured to apply a first voltage lower than a limit voltage corresponding to a saturation substrate-source voltage of the parasitic bipolar transistor.

Here again, the control circuit can be produced in different ways.

According to one embodiment, the control circuit comprises a resistive element that has a first terminal connected to the source of the MOS transistor and a second terminal connected to the substrate and to the gate of the MOS transistor.

Such a control circuit makes it possible to simultaneously combine the bipolar and MOS effects while amplifying them and reducing the leakage currents.

It is also possible to obtain a combined effect of the MOS and bipolar effects by using a control circuit that comprises, for example, a first resistive element connected between the source and the substrate of the MOS transistor, and a second resistive element connected between the gate and the source of the MOS transistor.

When the block comprising the MOS transistor no longer provides reversibility, that is to say exhibits no symmetrical behaviour with respect to the direction of the current pulses, it may be advantageous, in particular for the applications of protection against electrostatic discharges, for the electronic means to also comprise a diode, the cathode of which is connected to the first terminal and the anode of which is connected to the second terminal.

In a variant, the electronic means can comprise two cascode-connected blocks, and more particularly, according to one embodiment, the MOS transistor of each block has its gate connected to its substrate, the two substrates of the two MOS transistors are connected together, the drain of a first MOS transistor is connected to the first terminal, the source of the second MOS transistor is connected to the second terminal and a resistive element is connected between the substrate of the second MOS transistor and the second terminal.

Such a device can, for example, be used as a trigger element and is then capable of supplying, in response to a current pulse, a pulsed control voltage of around a few tenths of a volt, for example 0.3 volt, between the source and the drain of the second MOS transistor.

According to another aspect, there is proposed a protection device for protection against electrostatic discharges, comprising a first and a second terminal, the first and the second terminals being intended to be connected to a component to be protected, and electronic means coupled between the two terminals.

According to a general characteristic of this aspect, the electronic means comprise at least one first block comprising an MOS transistor that has its gate coupled to its substrate without being directly coupled to the second terminal, the first electrode of the MOS transistor, for example its drain, being coupled to the first terminal, the second electrode of the MOS transistor, for example its source, being coupled to the second terminal, and a first resistive element coupled between the substrate of the MOS transistor and the second terminal.

With such a configuration of the transistor, said transistor will switch, in the presence of an electrostatic discharge applied between the two terminals of the device, at least transiently at the start of the electrostatic discharge, to its hybrid operating mode because the bias conditions of the substrate and of the gate to obtain a hybrid operation mode are at least transiently met.

That being the case, even though this hybrid operation appears with such a configuration for 1 micron technologies (gate length of 1 micron), it becomes increasingly significantly interesting in ESD protection applications in particular, with the reduction of the gate lengths. Thus, such ESD protection devices have been produced with 250 nanometre technologies. These ESD protection devices have also proved particularly suitable for the advanced technologies, such as, for example, the technologies up to 65 nanometres, in particular the 32 nanometre technology.

According to one embodiment, the first block comprises a second resistive element connected between the gate and the source of the MOS transistor.

According to one embodiment, the electronic means also comprise a diode, the cathode of which is connected to the first terminal and the anode of which is connected to the second terminal.

According to another variant embodiment, also allowing for a reversibility of the device with respect to the direction of the electrostatic discharge, that is to say exhibiting symmetrical (identical) behaviour with respect to the direction of the electrostatic discharge, the gate of the MOS transistor of the first block is not coupled to the second terminal and the electronic means also comprise a second block comprising an MOS transistor that has its gate coupled to its substrate without being coupled to the first terminal, its first electrode coupled to the first terminal and a resistive element coupled between the substrate of the transistor and the first terminal, the first electrode of the MOS transistor of the first block being coupled to the first terminal via the MOS transistor of the second block, the MOS transistor of the second block having its second electrode coupled to the second terminal via the MOS transistor of the first block.

According to one embodiment, each block also comprises an additional element configured to delay the discharge of the gate capacitance of the MOS transistor.

This additional element can be connected between the substrate and the gate of the MOS transistor or else between the substrate of the MOS transistor and the corresponding resistive element.

This additional element can comprise a diode, the cathode of which is connected to the gate of the MOS transistor or else an additional MOS transistor that has its gate connected to its substrate and one of its other two electrodes connected to the gate of the MOS transistor.

In particular when high currents are required to pass into the ESD protection device, the electronic means can advantageously also comprise a triac coupled between the first terminal and the second terminal and the gate of which is coupled to the common connection terminal between the two blocks.

According to one embodiment, the triac comprises two fingers respectively produced in an integrated manner within two semiconductive wells, and the two blocks are respectively produced in an integrated manner on and within the two semiconductive wells.

According to another aspect, there is proposed an input/output cell of an integrated circuit, comprising an input/output pin, a first power supply terminal, a second power supply terminal, a first ESD protection device as defined hereinabove coupled between the first power supply terminal and the input/output pin, a second ESD protection device as defined hereinabove coupled between the input/output pin and the second power supply terminal, and a third ESD protection device as defined hereinabove coupled between the first power supply terminal and the second power supply terminal.

According to another aspect, there is proposed an integrated circuit comprising at least one input/output cell as defined hereinabove.

According to another aspect, there is proposed a method of protecting a component against electrostatic discharges, the method comprising a connection between a first and a second terminal of the component of at least one MOS transistor that includes a parasitic bipolar transistor, the MOS transistor having a first electrode, for example its drain, coupled to the first terminal, its second electrode, for example its source, coupled to the second terminal; and, in the presence of an electrostatic discharge between the two terminals, the method comprises an activation of the MOS transistor to place it in a hybrid mode that includes an MOS-type operation in a below-threshold mode and an operation of the parasitic bipolar transistor.

According to one implementation, in the presence of said electrostatic discharge between the two terminals, a non-zero first voltage is applied to the substrate of the MOS transistor and a second voltage lower than the threshold voltage is applied to the gate of the MOS transistor.

According to one implementation, a first voltage lower than a limit voltage corresponding to a saturation substrate-source voltage of the parasitic bipolar transistor is applied.

Figure 12:
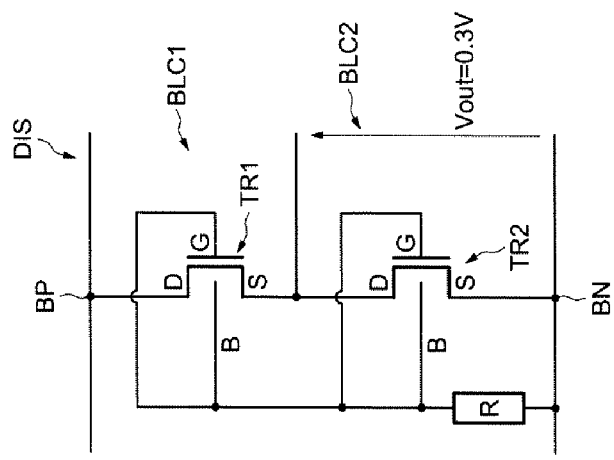
Figure 13:
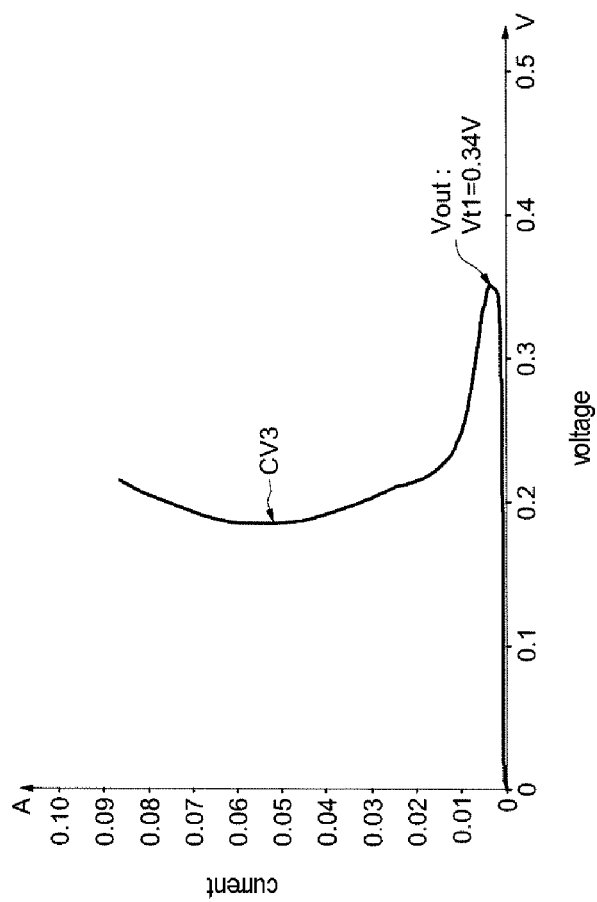

Other advantages and features of the invention will become apparent from reading the detailed description of by no means limiting implementations and embodiments, and the appended drawings in which:

FIG. 1 very schematically illustrates one embodiment of an electronic device according to the invention that can be used in particular to protect a component against electrostatic discharges;

FIGS. 2 to 11 diagrammatically illustrate various embodiments and implementations of the invention;

FIGS. 12 and 13 diagrammatically illustrate another embodiment of a device according to the invention that can be used, for example, as a trigger element (trigger being a term commonly used by those skilled in the art)

Figure 28:
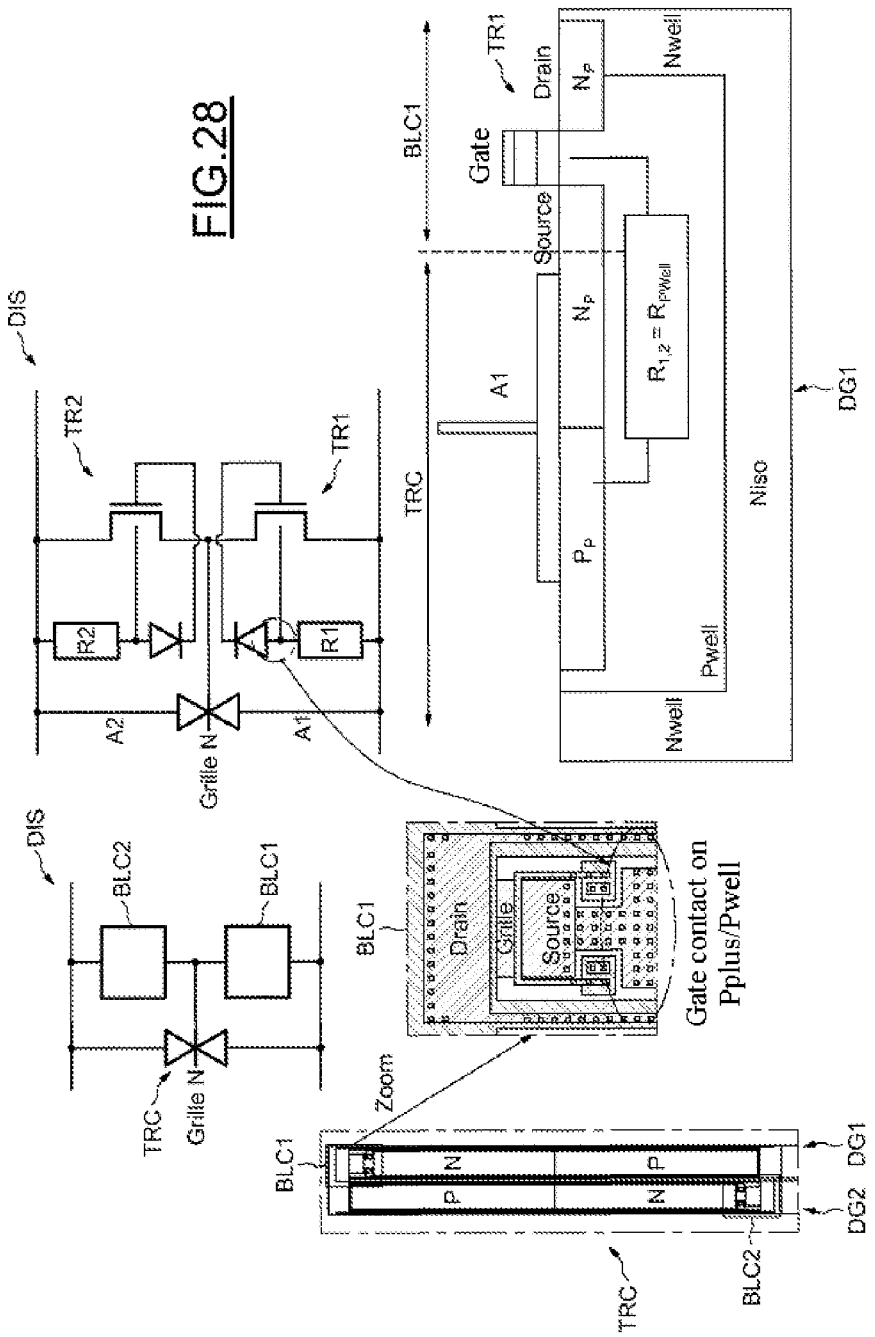
Figure 29:
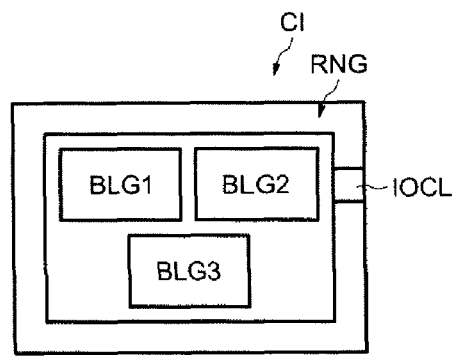
Figure 30:
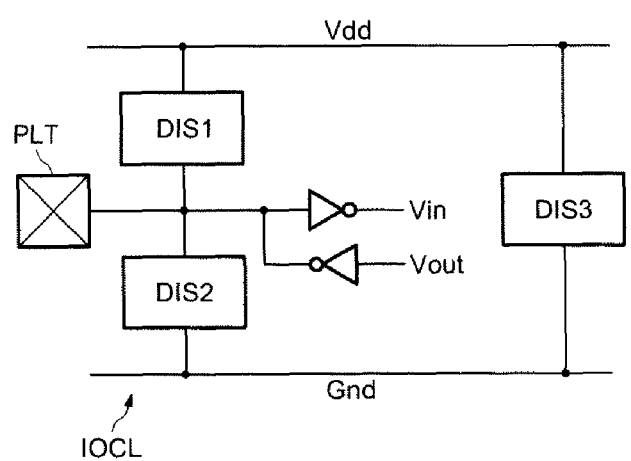

FIGS. 14 to 28 diagrammatically illustrate yet other embodiments of a device according to the invention, and, FIGS. 29 and 30 diagrammatically illustrate an embodiment of an integrated circuit and of an input/output cell of an integrated circuit according to the invention.

In FIG. 1, the reference DIS designates an electronic device that forms, in this variant embodiment, a device for protecting an electronic component CMP against electrostatic discharges (ESD). The component CMP is connected to a first terminal BP and to a second terminal BN of the device DIS.

As an indication, when the component CMP is operating, the terminal BP may be linked to a positive voltage Vp and the terminal BN may be linked to negative or zero (ground) voltage Vn.

When the component CMP is not operating, it may be subjected to an electrostatic discharge which is typically reflected in a very brief current pulse (typically a few microseconds), of which the current spike is, for example, around 2 amperes and typically occurs after 10 nanoseconds. Typically, this corresponds for example to a pulsed potential difference applied between the terminals BP and BN through an R-L-C equivalent circuit, the voltage spike of which occurs after 10 nanoseconds with an intensity of 1 to 4 kVolts HBM, for example 4 kVolts HBM for 2.5 amperes.

It will be recalled here that the letters HBM are an acronym for "human body model" that is well known to those skilled in the art in the field of protection against electrostatic discharges and notably designate an electrical circuit that aims to model an electrostatic discharge delivered by a human being and usually used to test the sensitivity of the devices to electrostatic discharges. This electrical circuit HBM, which is the equivalent R-L-C circuit mentioned hereinabove and to which a high voltage is applied, notably comprises a 100 pF capacitor which is discharged through a 1.5 kilo-ohm resistor in the device to be tested. Thus, in the present case, an electrostatic discharge of 4 kilovolts HBM means that a potential difference of 4 kilovolts is applied to the electrical circuit HBM.

It is then best for this current pulse to flow through the device DIS and not through the component CMP to be protected.

The device DIS therefore aims to absorb this current pulse and to avoid the overvoltages at the terminals of the component CMP.

Figure 2:
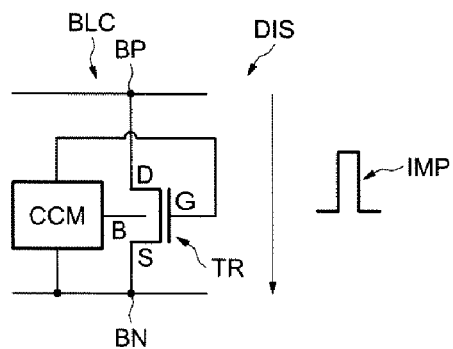

The component DIS consequently comprises electronic means coupled between the two terminals BP and BN which, as illustrated in particular in FIG. 2, comprise a block BLC comprising an MOS transistor TR, in this case an NMOS transistor.

The drain D of the transistor TR is coupled to the first terminal BP whereas the source S of this transistor TR is coupled to the second terminal BN.

The transistor TR includes a parasitic bipolar transistor, the collector of which corresponds to the drain D of the NMOS transistor, the emitter of which corresponds to the source S of the MOS transistor, the base of which corresponds to the substrate B of the NMOS transistor.

The transistor TR is configured to, in the presence of a current pulse IMP between the two terminals BP and BN, operate in a hybrid mode which includes an MOS-type operation in a below-threshold mode and an operation of the parasitic bipolar transistor.

Thus, the gate-source voltage $V_{GS}$ of the MOS transistor remains lower than the threshold voltage VT of the transistor, whereas a voltage is applied between the substrate B (or "bulk", to use a term well known to those skilled in the art) and the source S of the transistor TR, a non-zero voltage $V_{BS}$ so as to activate the parasitic bipolar transistor.

That being the case, a voltage lower than a limit voltage is preferably applied to the substrate B of the transistor TR so as to avoid setting the parasitic bipolar transistor to saturation mode. As an indication, this limit voltage is in this case of the order of 0.7 volt.

Thus, by applying a voltage to the substrate B of the transistor TR, the parasitic bipolar transistor is activated while the current gain β of this parasitic bipolar transistor is controlled via the voltage applied to the gate of the transistor TR.

In the embodiment illustrated in FIG. 2, the block BLC comprises a control circuit CCM, for example connected between the terminals BP and BN, configured to, in the presence of said current pulse IMP, apply a non-zero voltage to the substrate B of the MOS transistor and a voltage lower than the threshold voltage to the gate of the MOS transistor.

Figure 3:
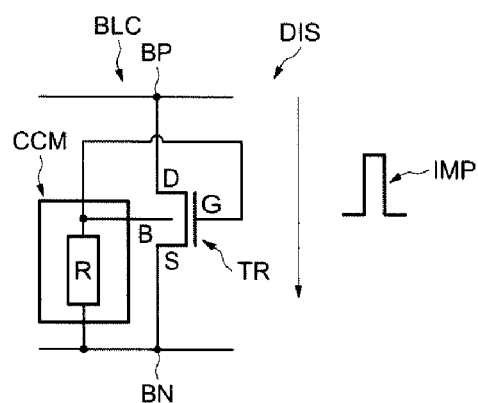

In the exemplary embodiment illustrated in FIG. 3, the control circuit CCM comprises a resistive element R connected between the substrate B and the source S of the transistor TR.

Moreover, the gate of the transistor TR is linked to the substrate B.

The electrostatic discharge is transmitted through the drain-substrate capacitance $C_{DB}$ to the substrate of the transistor TR and via the drain-gate capacitance $C_{DG}$ to the gate G of the transistor TR.

The current pulse IMP is converted by the resistor R into a substrate-source voltage $V_{BS}$ and into a gate-source voltage $V_{GS}$.

The presence of the capacitance $C_{DB}$, which is very great relative to the capacitance $C_{DG}$, and the connection between the substrate and the gate of the transistor TR makes it possible to have bipolar and MOS effects that are both combined and amplified. In practice, since the capacitance $C_{DB}$ is very great relative to the capacitance $C_{DG}$, the pulse transmitted to the gate is weaker than that transmitted to the substrate. The absence of connection between the gate and the substrate does, however, make it possible to obtain, by this capacitive coupling, these combined bipolar and MOS effects, but the presence of the connection between the gate and the substrate makes it possible for the gate to be biased more (through the pulse transmitted via the capacitance $C_{DG}$ and through the pulse transmitted to the substrate) and consequently, to amplify these combined effects, because the closer the gate voltage comes to the threshold voltage of the MOS transistor, the more the current gain increases.

Moreover, the higher the product of R times $C_{DB}$, the lower the triggering voltage or threshold of the protection device. Thus, depending on the technology used, the value of R will be chosen notably so as to have an acceptable triggering threshold that is compatible with below-threshold operation of the MOS transistor.

As an indication, for a 40 nanometre technology (gate length at 40 nanometres), the capacitance is $C_{DB}=10^{-10}$ F/m and the capacitance $C_{DG}$ is equal to $10^{-13}$ F/m.

A resistance R of between 100 ohms and 100 kiloohms, for example equal to 500 ohms will then for example be chosen.

Figure 4:
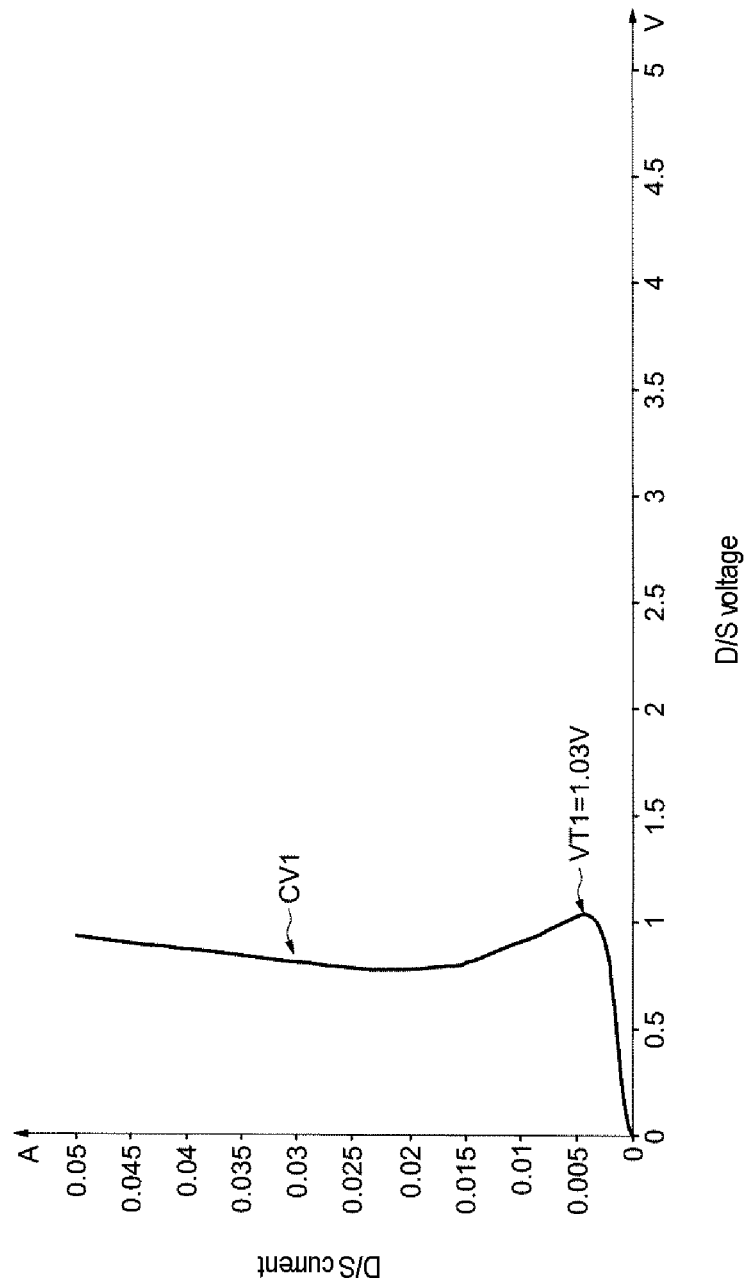
Figure 5:
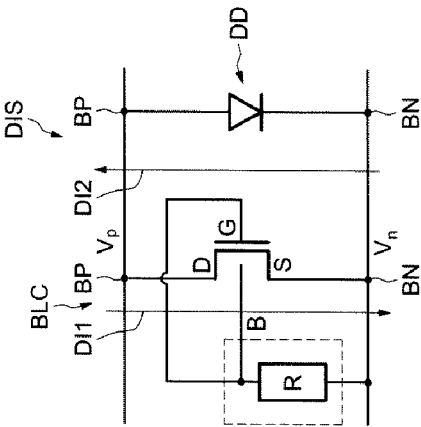

It can thus be seen, as illustrated in FIG. 4 by the curve CV1, that the block BLC of the device DIS absorbs the current due to the electrostatic pulse while limiting the voltage at the terminals of the component CMP to a voltage VT1 of the order of 1 volt. This voltage VT1 is the triggering threshold, from which the current absorbed by the protection device DIS is significant.

Such a triggering threshold should be compared with that, of the order of 4.5 volts, obtained with a conventional ESD protection using an NMOS transistor, the gate and the substrate of which are directly connected to ground.

In the presence of a negative electrostatic discharge, that is to say one that gives rise to a positive potential difference between the terminal BN and the terminal BP (giving rise to a current pulse that goes from the terminal BN to the terminal BP), the drain of the transistor TR is the electrode linked to the terminal BN, the source is the electrode linked to the terminal BP and the current flows, at the start of the pulse, through the resistor R and, when the voltage exceeds the threshold voltage of the diode (approximately 0.6 volt), through the passing diode of the substrate-source junction of the transistor TR.

The current pulse is therefore transmitted at the level of the terminal BP.

It should be noted that, at least transiently at the start of the negative pulse, the transistor TR also switches to a hybrid operating mode in particular because of the connection between the substrate B and the gate G.

The device of FIG. 3 protects the component against an ESD pulse in one direction or in another, without, however, being reversible, that is to say having a symmetrical behaviour from one direction of the pulse to the other.

In steady-state operation, that is to say when the component to be protected is operating, the voltage at the terminal BP is, for example, equal to the power supply voltage Vdd of the integrated circuit, the value of which depends on the technology used, whereas the voltage at the terminal BN is, for example, ground. Since the component is in steady-state operation, that is to say not in the presence of a current pulse between the two terminals BP and BN, and the drain-substrate diode is reversed, the substrate B and the gate G are biased to ground. The transistor TR is therefore blocked and consequently the device DIS does not trigger in steady-state operation.

Other types of control circuits CCM are possible.

Thus, it would also be possible to use a resistive bridge or even a capacitive bridge connected between the terminals BN and BP instead of a single resistance as illustrated in FIG. 3.

That being the case, the control circuit of FIG. 3 presents the advantage of offering almost no leakage current.

Another solution for protecting the component that is to be protected against a current pulse that is propagated both in the direction DI1 (FIG. 5), but also against a current pulse that may be propagated in the direction DI2, consists in associating with the block BLC a diode DD, the cathode of which is connected to the terminal BP and the anode of which is connected to the terminal BN. In practice, depending on the value of the resistance R, it may be more advantageous to use the embodiment of FIG. 5 than that of FIG. 3.

Figure 6:
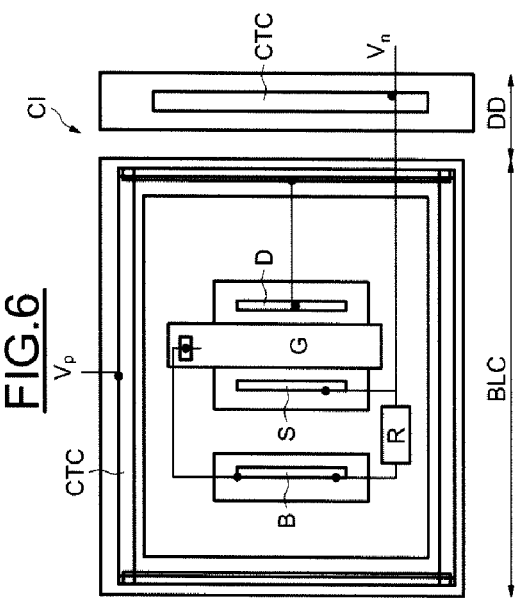
Figure 7:
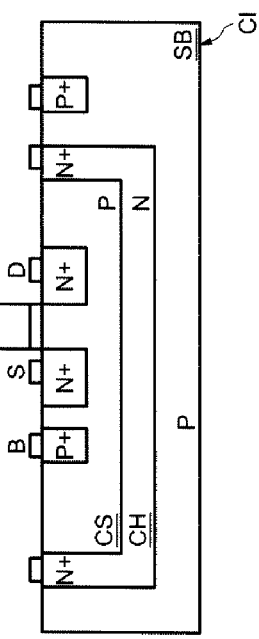

An exemplary embodiment of such a device DIS in integrated form is illustrated in FIGS. 6 and 7.

The block BLC is thus produced within a semiconductive well CS, for example of P conductivity type, insulated from the substrate SB which is itself of P conductivity type by a buried layer CH of N conductivity type.

The diode DD, for its part, is implemented by a PN junction. Contacts CTC are used to connect the different elements together in the manner illustrated in FIG. 5.

Figure 8:
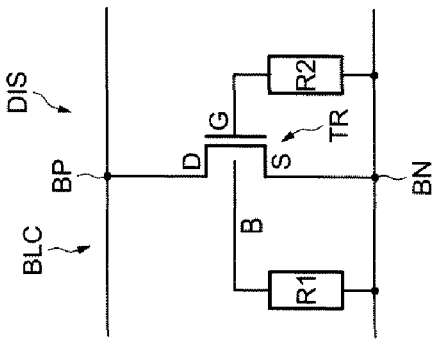

In another embodiment illustrated in FIG. 8, the control circuit comprises a first resistive element R1 connected between the source and the substrate of the MOS transistor TR and a second resistive element R2 connected between the gate and the source of the MOS transistor TR.

Here again, in a 40 nanometre technology, the resistors R1 and R2 can be taken to be equal to 500 ohms for example, or more generally in the range 100 ohms-100 kiloohms.

In this embodiment, the gate and the substrate of the transistor TR are not connected together.

A combined bipolar and MOS effect is therefore obtained through the capacitances $C_{DB}$ and through the capacitances $C_{DG}$. That being the case, this combined effect is not amplified unlike in the preceding embodiment because of the absence of connection between the substrate and the gate of the transistor.

Figure 9:
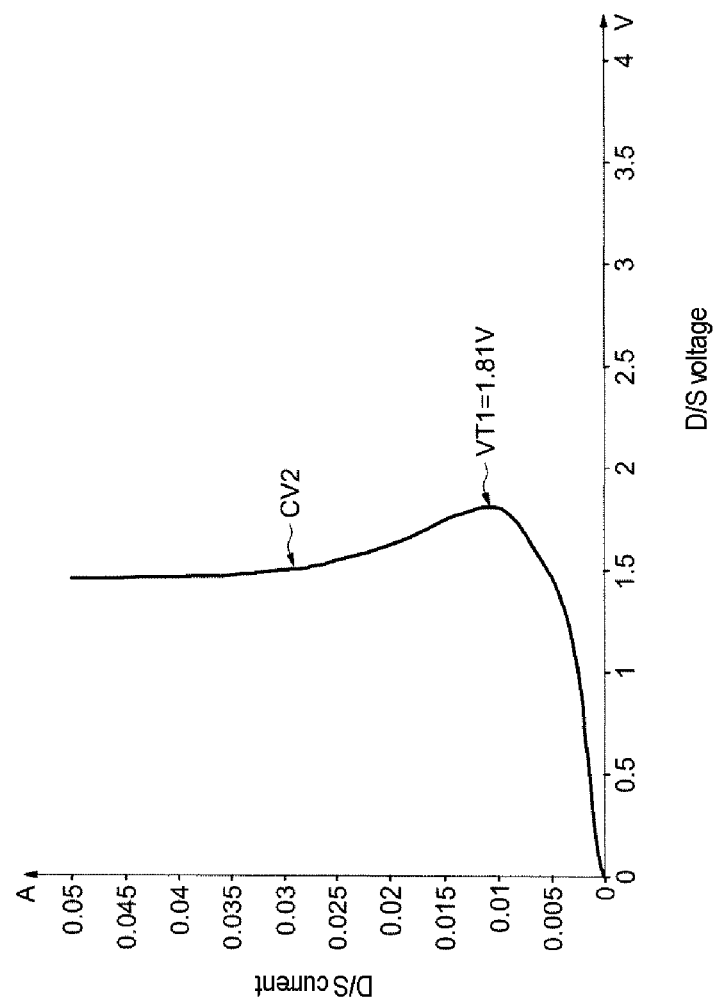

There is therefore obtained, as illustrated by the curve CV2 of FIG. 9, a protection device that makes it possible this time to limit the overvoltage at the terminals of the component CMP to 1.80 volts (triggering threshold) instead of around 1 volt previously.

Figure 10:
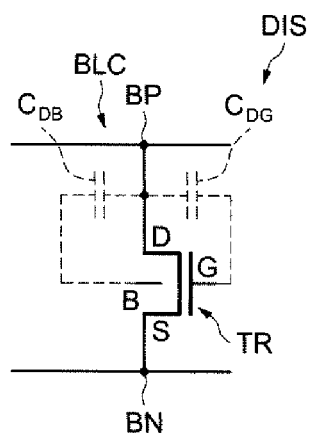
Figure 11:
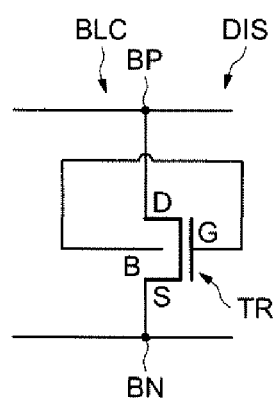

The embodiments illustrated in FIGS. 10 and 11 are embodiments in which the block BLC operates reversibly, that is to say that it can be used to protect, in a symmetrical (identical) manner, a component against a current pulse going from the drain to the source or from the source to the drain.

More specifically, as illustrated in FIG. 10, the substrate and the gate of the MOS transistor are left floating. The bipolar and MOS effect is then obtained by the gate-substrate capacitive coupling formed by the capacitors $C_{DB}$ and $C_{DG}$.

In order to have an amplified effect, it is also possible, as illustrated in FIG. 11, to electrically link the gate and the substrate of the transistor TR.

These embodiments are of particular interest for the transistors TR that have thick gate oxides, typically of the order of 50 Angströms.

That being the case, these embodiments offer very low triggering thresholds because of a very high resistance between the substrate and ground (absence of connection between the substrate and ground) and between the gate and ground (absence of connection between the gate and ground). Such a very low triggering threshold may be prejudicial in certain applications, in particular when the component to be protected injects current into another component, because this injection may lead to an unwanted triggering of the device DIS.

This is why it is preferable to use the embodiments described hereinabove that have a resistance between the substrate and ground and/or a resistance between the gate and ground. In practice, adjusting the value of this resistance makes it possible to raise the triggering threshold value.

In FIGS. 10 and 11, the drain of the MOS transistor is represented, in the interests of simplifying the drawing, as being the electrode coupled to the first terminal BP whereas the source of the MOS transistor is represented as being the electrode coupled to the second terminal regardless of the direction of the current pulse. This representation effectively corresponds to the case in which the current pulse is positive, that is to say goes from the drain (brought to the high potential) to the source (brought to the low potential).

That being the case, those skilled in the art know that the structure of an MOS transistor is symmetrical with respect to its two electrodes and that, in practice, the drain is designated as being the electrode brought to a high potential relative to a low potential applied to the other electrode which is then designated as being the source.

Also, in the case of a negative current pulse, that is to say one that goes from the electrode designated S in FIGS. 10 and 11, to the electrode designated D in FIGS. 10 and 11, it is the electrode designated S that is brought to the high potential and which therefore effectively forms the drain of the MOS transistor, whereas it is the electrode designated D that is brought to the low potential and which therefore effectively forms the source of the MOS transistor.

Thus, in these reversible embodiments, a first electrode of the transistor, coupled to the first terminal BP, effectively forms the drain or the source of the MOS transistor whereas the second electrode, coupled to the second terminal BN, effectively forms the source or the drain of the transistor, depending on the direction of the current pulse.

In the embodiment illustrated in FIG. 12, the device DIS comprises two cascode-connected blocks BLC1 and BLC2.

More specifically, in this embodiment, the MOS transistor TR1, TR2 of each block BLC1, BLC2 has its gate G connected to its substrate B.

Moreover, the drain of the first MOS transistor TR1 is connected to the first terminal BP whereas the source of the second MOS transistor TR2 is connected to the second terminal BN. Moreover, a resistive element R is connected between the substrate of the second transistor TR2 and the second terminal BN.

In the presence of a current pulse, this device DIS also implements a double bipolar and MOS effect on each block BLC1. Also, as illustrated in FIG. 13 by the curve CV3, the device DIS triggers at a voltage VT1 of the order of 0.3 volt, more specifically 0.34 volt in this exemplary embodiment.

Such a device DIS can also be used as protection means against electrostatic discharges.

That being the case, it can also be used in other applications, notably in a trigger application (trigger being a term commonly used by those skilled in the art). In practice, in the presence of a current pulse, a control voltage Vout can be delivered between the drain and the source of the transistor TR2 so as to control another device.

There is therefore obtained, in this case, a trigger element that is capable of delivering a very low control voltage, which is of particular interest for the advanced technologies.

Although in the examples described hereinabove one or more NMOS transistors have been used, the invention also applies to one or more PMOS transistors in a dual fashion. More specifically, the source of the PMOS transistor remains connected to the terminal BN which is likely to receive a positive voltage Vdd and the drain of the PMOS transistor remains connected to the terminal BP which, this time, is likely to receive a negative or zero voltage. Obviously, as explained hereinabove, given the symmetry of a PMOS transistor with respect to these two electrodes, in the reversible embodiments, a first electrode of the transistor, coupled to the first terminal BP, effectively forms the drain or the source of the PMOS transistor whereas the second electrode, coupled to the second terminal BN, effectively forms the source or the drain of the transistor, depending on the direction of the current pulse.

Figure 14:
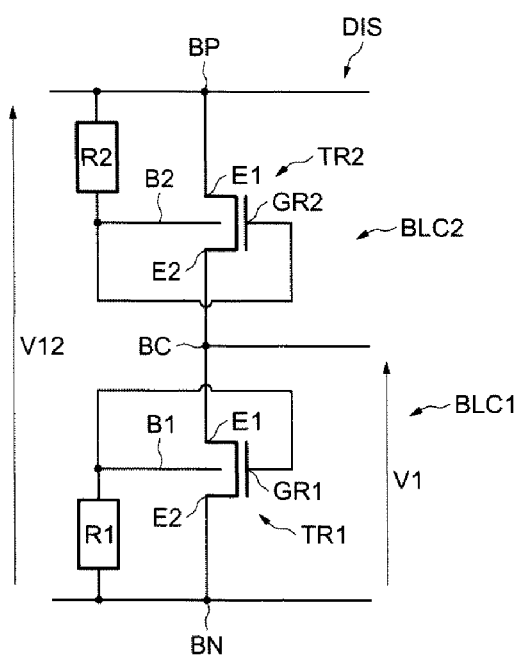

Reference is now made more particularly to FIG. 14, which illustrates another embodiment of a protection device DIS for protection against electrostatic discharges.

In this figure, the device DIS comprises two blocks BLC1, BLC2 coupled in series in a symmetrical manner between the two terminals BP and BN of the device.

As in FIG., 1, the component to be protected CMP is connected in parallel with the device DIS between the two terminals BP and BN.

The two blocks BLC1 and BLC2 are in this case identical.

More specifically, the first block BLC1 comprises an NMOS transistor TR1, the second electrode E2 of which is connected to the terminal BN and the gate GR1 of which is connected to the substrate B1 of the transistor without being connected to the terminal BN.

Moreover, a resistive element R1 is connected between the substrate B1 of the transistor TR1 and the terminal BN.

The block BLC1 therefore has a structure similar to that described with reference to FIG. 3.

By analogy, the block BLC2 comprises an NMOS transistor TR2, the first electrode E1 of which is linked to the first terminal BP and the second electrode E2 of which is linked to the first electrode E1 of the transistor TR1 of the first block BLC1.

Moreover, the gate GR2 of the transistor TR2 is linked to its substrate B2 without being connected to the terminal BP.

Furthermore, a resistive element R2 is connected between the substrate B2 and the terminal BP.

The first electrode E1 of the transistor TR1 and the second electrode E2 of the transistor TR2 form a common terminal BC.

This device has a configuration that is reversible with respect to the bias of the electrostatic discharge.

Thus, in the presence of a high potential on the terminal BP and of a low potential on the terminal BN, that is to say corresponding to a current pulse going from the terminal BP to the terminal BN, the electrode E1 of the transistor TR2 is its drain whereas the electrode E2 of the transistor TR2 is its source.

Moreover, the electrode E1 of the transistor TR1 is its drain and the electrode E2 of the transistor TR1 is its source.

In the case of a reverse-biased electrostatic discharge, that is to say one with a high potential on the terminal BN and a low potential on the terminal BP, the second electrodes E2 of the transistors TR1 and TR2 form the drains of these transistors, whereas the first electrodes E1 of these transistors form their sources.

In the presence of a positive electrostatic discharge, that is to say one that gives rise to a positive potential difference between the terminal BP and the terminal BN (giving rise to a current pulse that goes from the terminal BP to the terminal BN), the current flows, at the start of the pulse, through the resistor R2 and, when the voltage exceeds the threshold voltage of the diode (approximately 0.6 volt), through the passing diode of the substrate-source junction (electrode E2) of the transistor TR2.

The current pulse is therefore transmitted at the level of the common terminal BC and, because of this, the transistor TR1 switches at least transiently at the start of the pulse, to its hybrid operating mode. Obviously, if the gate-source voltage of the transistor TR1 becomes greater than the threshold voltage of the MOS transistor, the latter switches to an MOS-type operating mode.

It should also be noted that, at least transiently at the start of the pulse, the transistor TR2 also switches to a hybrid operating mode in particular because of the connection between the substrate B2 and the gate GR2.

Figure 15:
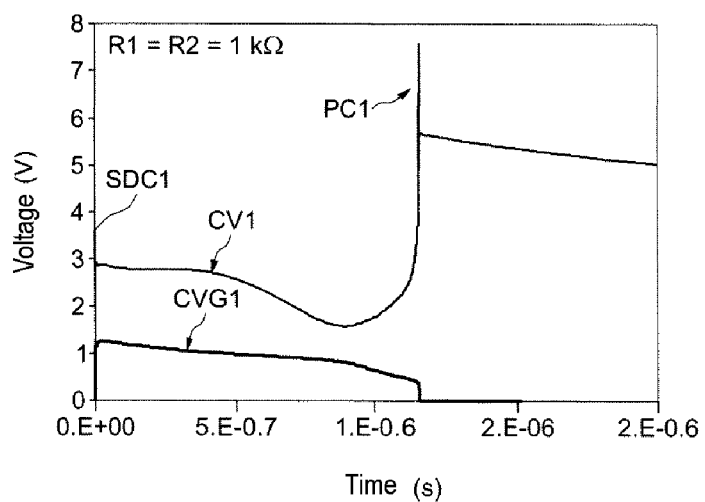

FIG. 15 illustrates the trends of the voltage V1 at the terminals of the transistor TR1 and of the gate voltage VG1 of the transistor TR1.

These trends were obtained for transistors produced using 40 nanometre technology, with resistors R1 and R2 both equal to 1 kilo-ohm.

Moreover, the electrostatic discharge is a discharge equal to 4 kilovolts HBM.

In FIG. 15, the curve CV1 represents the trend of the voltage V1 whereas the curve CVG1 represents the trend of the gate voltage of the transistor TR1.

It will be noted that the device DIS of FIG. 14 has a triggering threshold SDC1 of the order of 3.7 volts. This triggering threshold occurs after approximately 0.1 nanosecond. It will be seen in more detail hereinbelow that the voltage V1 at the common terminal BC can be used to control a power unit, for example a triac. In practice, the electronic means of the device of FIG. 14 can also be used as trigger element, whether in an ESD protection application, as will be seen, for example, with reference to FIGS. 22 to 24, or in any other application. This is why FIG. 25 shows the trend of the voltage V1 which is the control voltage for another element, for example a triac, when the electronic means are used as trigger element. In this case, the threshold SDC1 is the triggering threshold that will be used to trigger the triac for example.

That being the case, when the device DIS of FIG. 14 is used as such as ESD protection means, it is the voltage difference V12 between the terminals BP and BN that should be observed. Also, the trend of this voltage V12 follows, at the start of the electrostatic discharge, that of the voltage difference V1 with an offset of a few volts, to then converge towards the curve CV1 a little before the region of the spike PC1. In this case, the triggering threshold of the device DIS, that is to say the voltage difference V12 from which a significant current is absorbed in the device DIS, is of the order of 6 volts. This is a considerable gain over the conventional two-stage ESD protection devices, which will trigger in the region of 8 volts.

Figure 17:
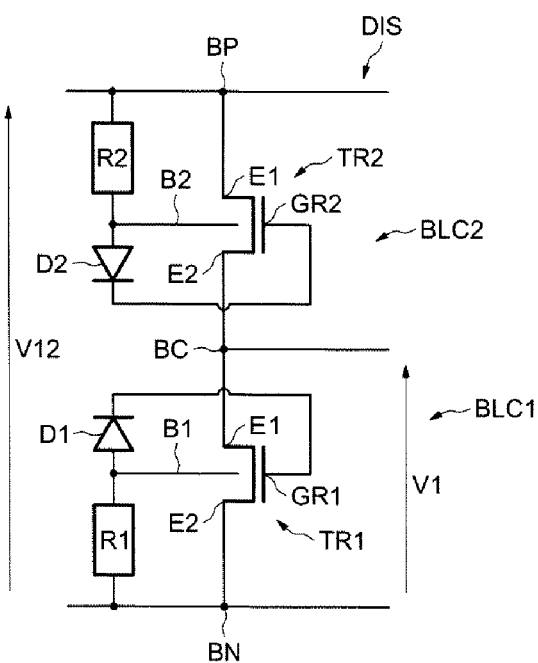
Figure 19:
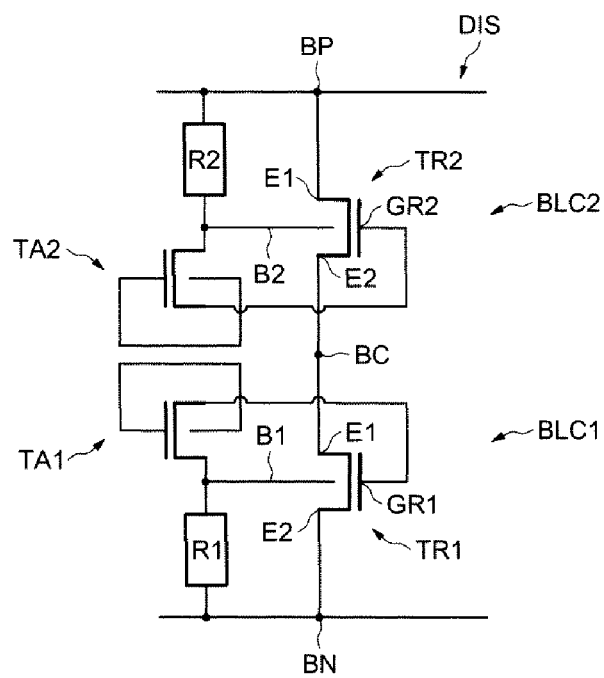
Figure 20:
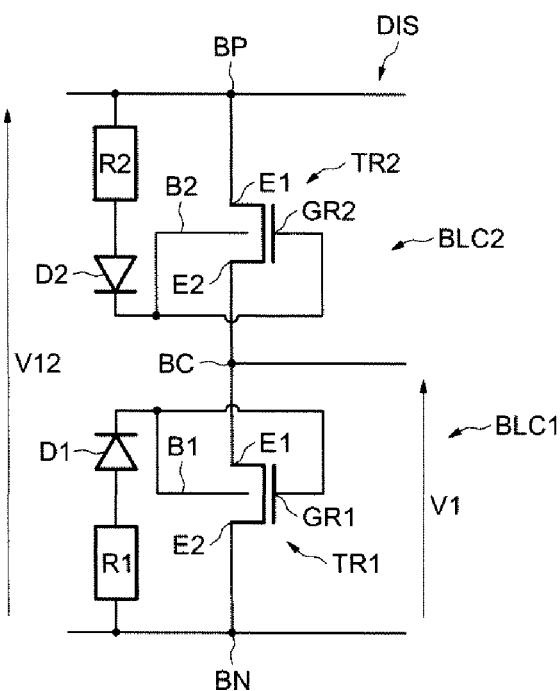

The above explanation (trend of the voltage difference V12 relative to V1) for the device of FIG. 14, is valid for the devices illustrated in FIGS. 17, 19 and 20.

In steady-state operation, that is to say when the component to be protected is operating, with, for example, a power supply voltage Vdd present at the terminal BP and ground present at the terminal BN, the resistor R2 and the substrate-source junction of the transistor TR2 can be used to pull the potential of the common terminal BC to a high level. Moreover, the substrate-drain junction of the transistor TR1 is not passing since the potential of the substrate B1 of the transistor TR1 is pulled to ground via the resistor R1. Because of this, the gate GR1 is also pulled to ground. The transistor TR1 is therefore blocked. The device DIS is therefore not triggered in steady-state operation.

Obviously, what has just been described for a positive electrostatic discharge is identical for a negative electrostatic discharge, the roles of the transistors TR1 and TR2 being reversed. Curve trends are then obtained that are symmetrical compared to those illustrated in FIG. 15.

Also, in steady-state operation, this time it is the resistor R1 and the substrate-source junction of the transistor TR1 that are used to keep the node BC at the high voltage level (as an absolute value).

It will be noted from FIG. 15 that the curve CV1 has a spike PC1 towards the end of the ESD pulse. This spike is in this case of the order of 7.5 volts. It should be noted, as indicated hereinabove, that the trend of the voltage V12 also exhibits a spike at the level of the spike PC1.

This spike is explained by the fact that, at the end of an ESD pulse, the gate capacitance of the transistor TR1 is discharged. Because of this, at a given moment, the gate voltage will be cancelled out but, since at this instant, the ESD pulse is not totally finished, there remains a current ripple which provokes the voltage spike PC1.

In some applications, this voltage spike may be a problem because it is greater than the triggering threshold of the device (of the order of 6 volts).

Figure 16:
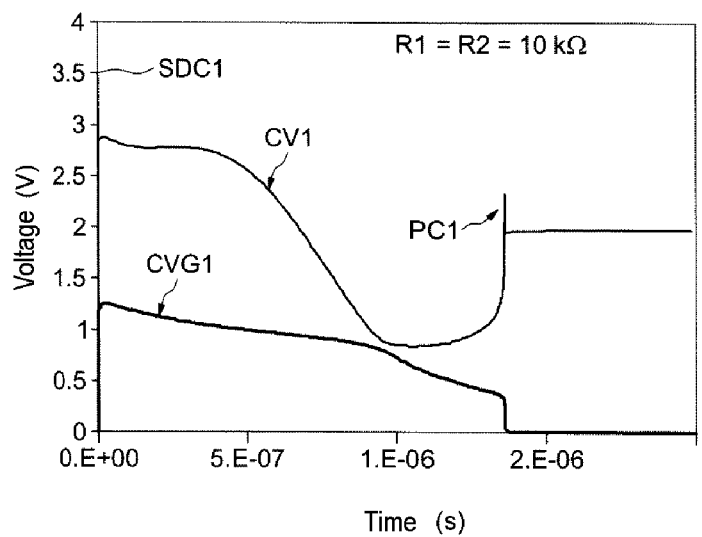

One solution for reducing this voltage spike PC1 involves increasing the value of the resistors R1 and R2. Thus, as illustrated in FIG. 16, in the case where values of 10 kilo-ohms are adopted for the resistors R1 and R2, it can be seen that the triggering threshold SDC1 remains substantially the same, but the value of the voltage spike PC1 is reduced from 7.5 volts to 2.2 volts.

Another embodiment of the device DIS is illustrated in FIG. 17. In this figure, it can be seen that each block BLC1, BLC2 comprises a diode DE D2 connected between the gate and the substrate of the corresponding transistor.

More specifically, the cathode of the diode is linked to the gate of the corresponding transistor, whereas the anode is linked to the substrate of the transistor and also to the corresponding resistor R1 or R2.

This diode will be used to delay the discharge from the gate capacitance of the corresponding transistor to the end of the ESD pulse.

Figure 18:
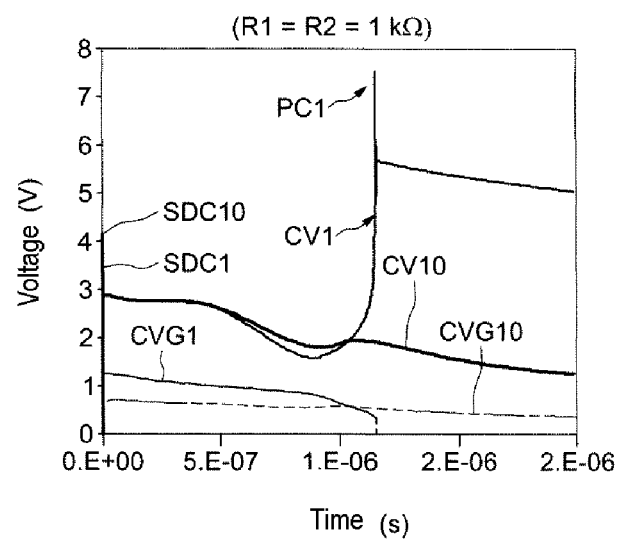

This is illustrated in FIG. 18.

This figure again shows the curves CV1, CVG1 of FIG. 15, and also shows the trend of the voltage V1 (curve CV10) at the terminals of the transistor TR1 in the device of FIG. 17. It can then be seen (curve CVG10) that the gate voltage of the transistor TR1 takes much longer to reach the zero value, which enables the transistor TR1 to remain passing for longer and which makes it possible to considerably reduce (curve CV10) the voltage spike PC1 of the curve CV1.

That being the case, it will be noted that the triggering threshold SDC10 (relative to the voltage V1) of the device DIS is slightly higher than the triggering threshold SDC1 of the device of FIG. 14.

Consequently, the triggering threshold of the device DIS relative to the voltage V12 is also slightly higher than the triggering threshold of the device DIS of FIG. 14.

There again, what has just been described for a positive electrostatic discharge is valid by symmetry for a negative electrostatic discharge.

In FIG. 19, the diodes have been replaced by auxiliary transistors TA1, TA2. Each transistor TA1, TA2 is an NMOS transistor that has its gate connected to its substrate, and a first electrode connected to the gate of the corresponding transistor TR1, TR2 whereas the other electrode is connected to the corresponding resistive element RE R2.

Such an additional transistor will therefore, upon the ESD pulse, amplify the hybrid operation of the corresponding transistor TR1, TR2 and, at the end of the ESD pulse, delay the discharge from the gate capacitance of the transistor TR1, TR2. In this embodiment, the amplification of the hybrid operation of the transistor TR1, TR2 is faster than in the embodiment of FIG. 17, because in the embodiment of FIG. 17, it is essential to wait until the threshold voltage of the diode has been crossed in order to be able to amplify the hybrid operation of the transistor TR1, TR2, whereas the presence of the additional transistors TA1, TA2 which themselves switch at least transiently to their hybrid operating mode makes it possible to overcome the constraint of the threshold voltage of the diode and amplify more rapidly.

In the embodiment of FIG. 20, the additional element, in this case a diode, that is used to delay the discharge from the gate capacitance at the end of the ESD pulse, is now connected between the substrate of the corresponding transistor and the corresponding resistive element.

More specifically, in the block BLC1, the cathode of the diode D1 is connected to the substrate of the transistor TR1 and the anode is linked to the resistor RE whereas, in the block BLC2, the cathode of the diode D2 is linked to the substrate of the transistor TR2, and the anode to the resistor R2.

Moreover, each transistor TR1, TR2 has its substrate directly connected to its gate.

Because of this direct connection between the substrate and the gate, there is therefore obtained an amplified hybrid operation of the corresponding transistor in the event of an ESD pulse. Moreover, the diode here again makes it possible to delay the discharge from the gate capacitance of the transistor at the end of the ESD pulse. Also, this capacitance will this time be discharged into the substrate of the transistor, which will contribute to the hybrid operation of the transistor at the end of the ESD pulse and will allow in particular more rapid collection of the ESD discharge. In other words, in this embodiment, there is a combined MOS-bipolaire effect of the transistor TR1, TR2 at the start of the ESD pulse and at the end of the ESD pulse.

Figure 21:
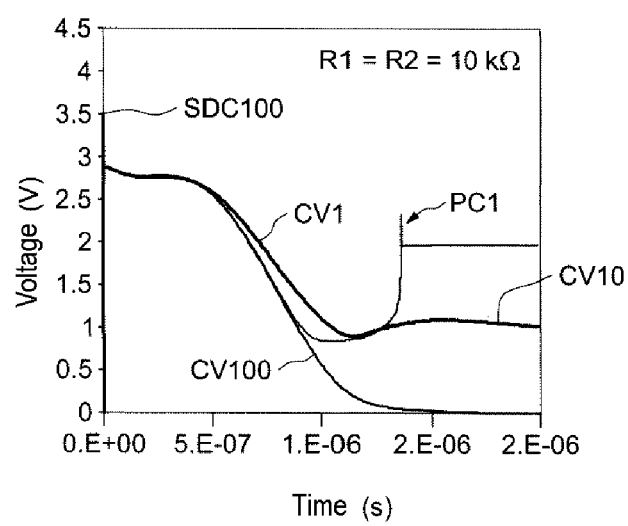

It can then be seen, in FIG. 21, that the trend of the voltage V1 (curve CV100 and triggering threshold SDC100) is even more favourable at the end of an ESD pulse compared to the trends and curves CV1 and CV10 corresponding to the embodiments of FIGS. 14 and 17.

The trend of the voltage V12 would be the same as that of the voltage V1 at the end of a pulse.

Obviously, in the embodiment of FIG. 20, the diode could be replaced by an auxiliary transistor of the type of that illustrated in FIG. 19.

In the case where relatively high currents have to be absorbed by the protection device DIS, it may be particularly advantageous for the electronic means of this device DIS to include a power unit, for example a triac TRC connected between the two terminals BP and BN of the device and the gate of which is linked to the common terminal BC of the two blocks BLC1 and BLC2.

Figure 22:
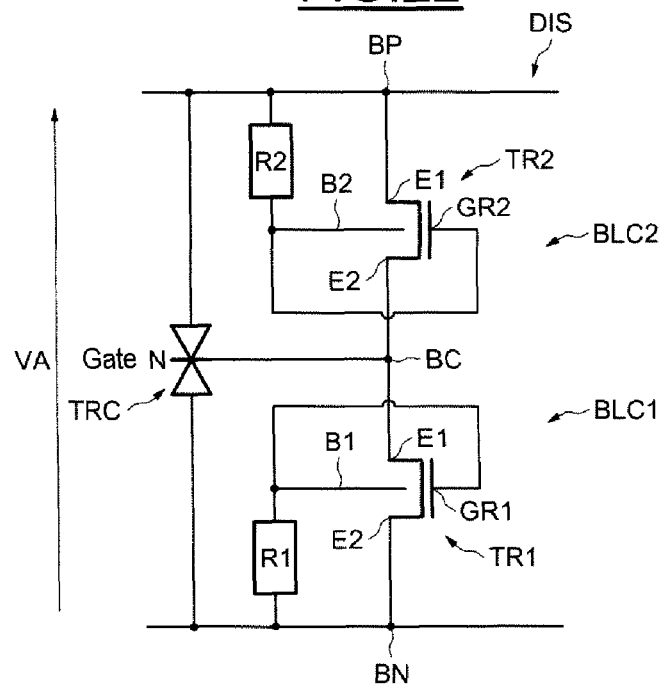
Figure 23:
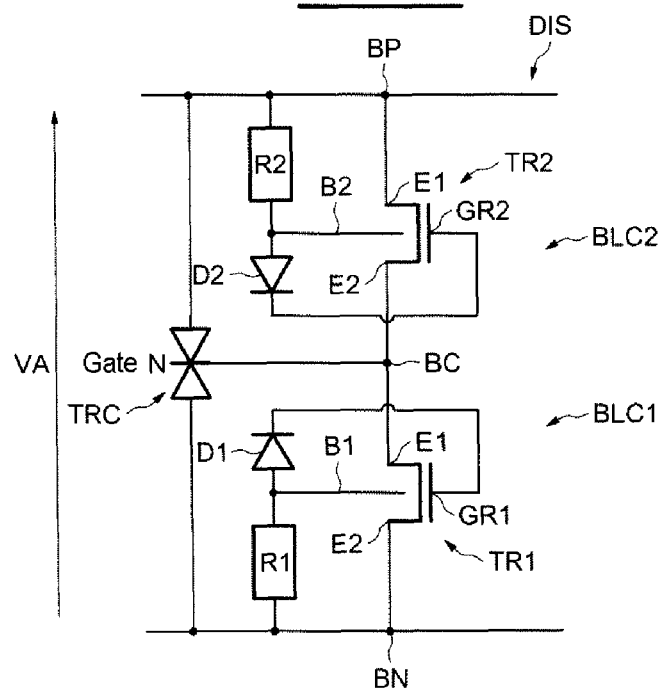
Figure 24:
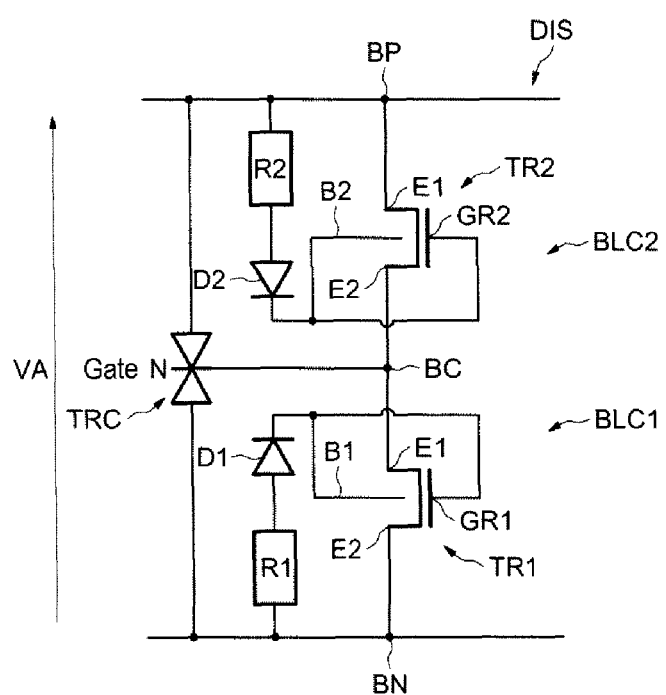
Figure 25:
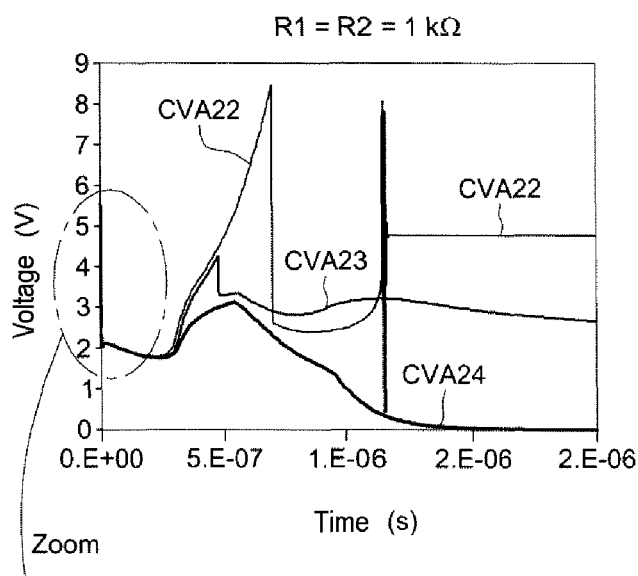

This is illustrated in FIGS. 22 to 24.

In FIG. 22, the arrangement of the two blocks BLC1 and BLC2 corresponds to that illustrated in FIG. 14.

In FIG. 23, the arrangement of these two blocks corresponds to that illustrate in FIG. 17 whereas, in FIG. 24, this arrangement corresponds to that illustrated in FIG. 20.

FIG. 25 illustrates the trend of the voltage VA between the terminals BP and BN of the device DIS in the case of a positive ESD pulse.

Obviously, this trend would be symmetrically identical in the case of a negative ESD pulse, because of the reversibility of the device DIS.

The curve CVA22 corresponds to the trend of the voltage VA for the device illustrated in FIG. 22.

The curve CVA23 corresponds to the trend of the voltage VA for the device of FIG. 23 and the curve CVA24 corresponds to the trend of the voltage VA for the device of FIG. 24.

Figure 26:
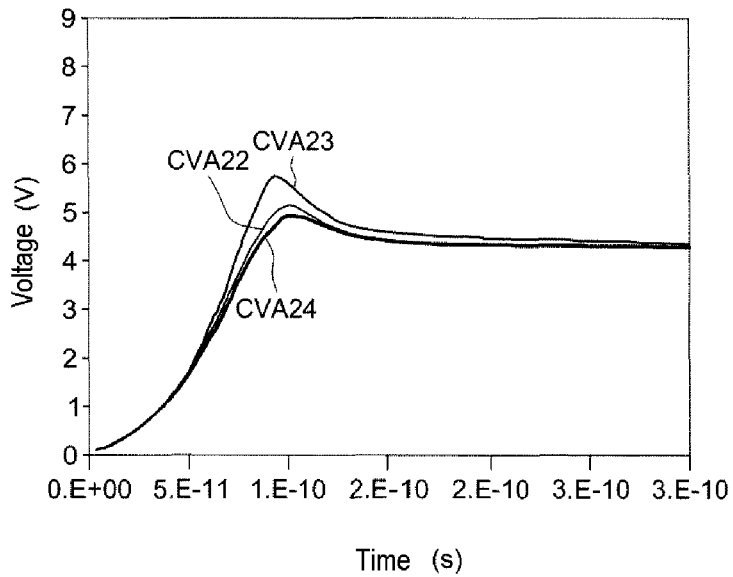

It will therefore be seen first of all that the triggering threshold of the device DIS occurs in the region of 0.1 nanosecond (FIG. 26, which is a close-up of the initial part of FIG. 25). This triggering threshold is of the order of 5.8 volts for the device of FIG. 23, whereas it is of the order of 5 volts for the devices of FIGS. 22 and 24.

It should be noted here that this is a considerable advance over the conventional two-stage ESD devices controlling a triac that generally trigger around 8 volts.

It will also be seen, in FIG. 25, that the curve CVA22 has a first spike which corresponds to the extinguishing of the triac when, during the ESD pulse, the latter is no longer passed through by a significant current. It will then be noted that this effect of extinguishing the triac is highly attenuated for the device of FIG. 23, and even more attenuated for the device of FIG. 24.

FIG. 25 also shows the second spike of the curve CVA22 which corresponds, as explained hereinabove, to the blocking of the blocks BLC1 and BLC2, because of the discharge from the gate capacitance of the MOS transistor in the presence of a ripple current Also, as explained hereinabove, it will noted that this second spike is the more attenuated in the case of the device of FIG. 24.

Figure 27:
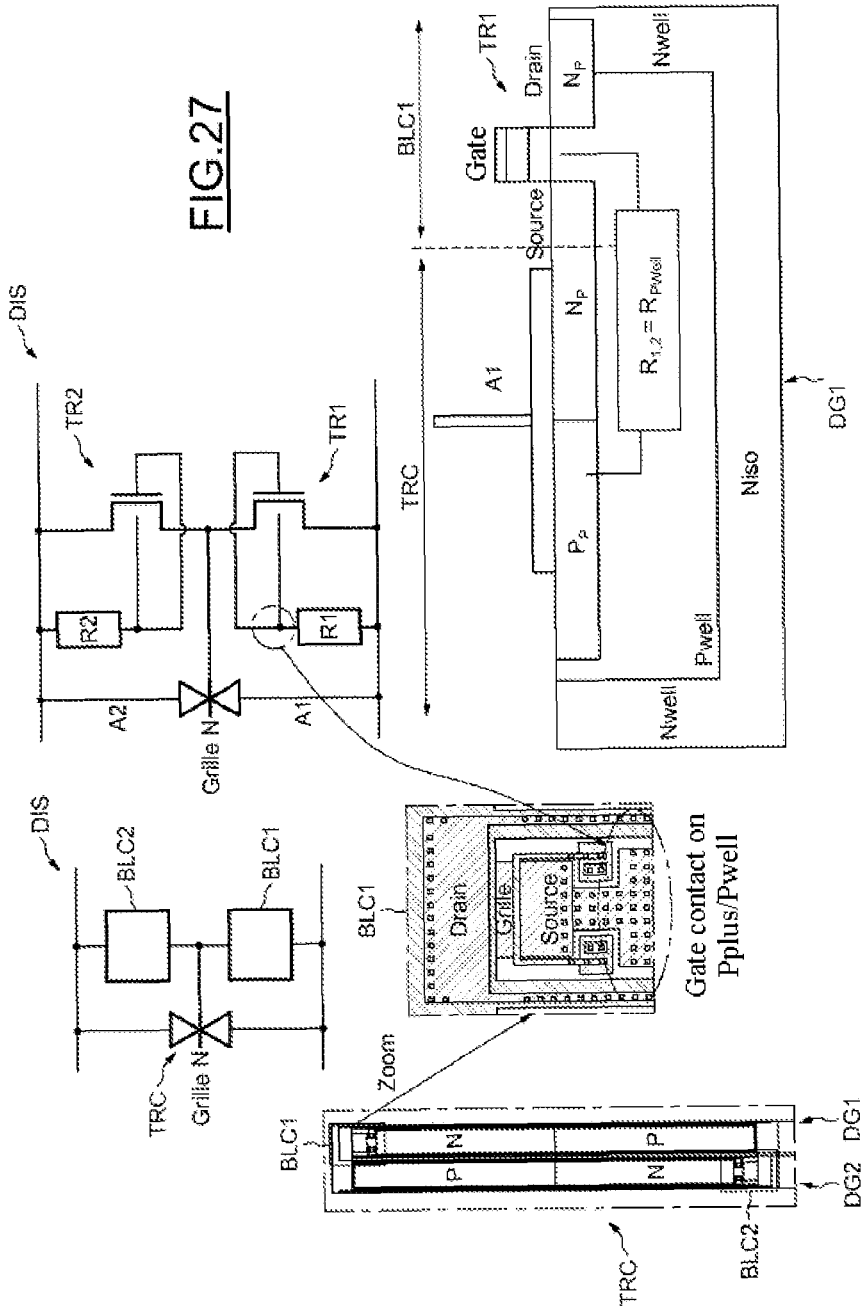

FIG. 27 diagrammatically illustrates an embodiment of the device DIS within an integrated circuit.

The triacs, which are double P-N-P-N structures, comprise, for example, two fingers DG1, DG2 respectively produced in an integrated fashion within two semiconductive wells. Also, the trigger elements of these triacs are, in the prior art, produced outside these fingers.

In this case, advantageously, the invention provides for these trigger elements, that is to say the blocks BLC1 and BLC2, to be produced in an integrated fashion on and within the two semiconductive wells containing the fingers DG1 and DG2. More specifically, the finger DG1 here comprises a semiconductive well referenced PWell, of P conductivity type, isolated from the rest of the substrate of the integrated circuit by an N-doped well referenced Nwell and by a buried layer referenced Niso and also N-doped.

The finger DG1 of the triac, corresponding to the structure A1 of the triac, comprises two P+ doped and N+ doped semiconductive regions referenced Pp and Np.

Moreover, the transistor TR1 (of the block BLC1 for example) is produced at the end of the finger DG1. Also, it will be noted here that the resistor R1 of the block BLC1 is formed by the resistance of the well PWell extending between the substrate of the transistor and the anode (region Pp) of the part A1 of the triac.

Similarly, the gate is linked to this resistor R by a connection to a P+ doped region of the well PWell.

FIG. 28 shows an exemplary integrated embodiment of a device DIS according to the invention, comprising, compared to the device DIS of the FIG. 27, a diode D connected between the resistor and the gate of the transistor of each block.

The only difference between the embodiment of FIG. 28 and that of FIG. 27 lies in the fact that, in FIG. 28, the gate contact is linked to an N+ doped region on the well PWell so as to produce said diode.

It is particularly advantageous to incorporate electrostatic discharge protection devices of the type of those that have just been described in an input-output cell of an integrated circuit.

As a nonlimiting example, such input/output cells IOCL can be arranged, as illustrated in FIG. 29, within a ring RNG at the periphery of the integrated circuit CI.

These cells IOCL can, for example, channel power supply voltages and/or data signals to and/or from functional blocks BLG1-BLG3 of the integrated circuit.

As illustrated in FIG. 30, the input-output cell comprises, for example, an input-output pin PLT for receiving/transmitting a signal. This cell comprises two power supply terminals Vdd and Gnd. A first device DIS1 of the type of that which has just been described hereinabove, for example the device of one of FIGS. 22 to 24, is then arranged between the power supply terminal Vdd and the input-output pin PLT.

A second protection element DIS2 is arranged between the input-output pin PL2 and the second power supply terminal Gnd. Finally, a third ESD protection device DIS3 is arranged between the two power supply terminals Vdd and Gnd.

Thus, such an input-output cell is protected, in an extremely simple manner, against an electrostatic discharge occurring between the two power supply terminals Vdd and Gnd, and against an electrostatic discharge that might occur either between the power supply terminal Vdd and the input-output pin or between the input-output pin and the power supply terminal Gnd. The functional blocks connected between the two terminals Vdd and Gnd are therefore also protected against an electrostatic discharge.

Obviously, as already stated previously, although in the examples described hereinabove with reference to FIG. 14 et seq, there are a number of NMOS transistors, the invention applies equally to a number of PMOS transistors in a dual manner.

Moreover, the invention that has just been described applies to all types of integrated technology, whether a technology on bulk substrate or a silicon on insulator (SOI) type (SOI being an acronym well known to those skilled in the art).

The invention claimed is:

1. An electronic device, comprising:
a first terminal;
a second terminal; and
electronic circuitry coupled between the first and second terminals, wherein the electronic circuitry comprises at least one block formed in a substrate and comprising an MOS transistor that has a first electrode, a second electrode, a gate and includes a parasitic bipolar transistor, the MOS transistor having its first electrode coupled to the first terminal, its second electrode coupled to the second terminal and also being configured to, in the presence of a current pulse between the first and second terminals, operate in a hybrid mode including an MOS-type operation in a below-threshold mode and an operation of the parasitic bipolar transistor, wherein the substrate and the gate of the MOS transistor are respectively left floating.

2. The device according to claim 1, wherein the block further comprises a control circuit configured to, in the presence of a current pulse between the first and second terminals, apply a first non-zero voltage to the substrate of the MOS transistor and a second voltage below a threshold voltage to the gate of the MOS transistor.

3. An electronic device, comprising:
a first terminal;
a second terminal; and
electronic circuitry coupled between the first and second terminals, wherein the electronic circuitry comprises at least one block formed in a substrate and comprising an MOS transistor that has a first electrode, a second electrode, a gate and includes a parasitic bipolar transistor, the MOS transistor having its first electrode coupled to the first terminal, its second electrode coupled to the second terminal and also being configured to, in the presence of a current pulse between the first and second terminals, operate in a hybrid mode including an MOS-type operation in a below-threshold mode and an operation of the parasitic bipolar transistor, wherein
the block further comprises a control circuit configured to, in the presence of a current pulse between the first and second terminals, apply a first non-zero voltage to the substrate of the MOS transistor and a second voltage below a threshold voltage to the gate of the MOS transistor, wherein the control circuit is configured to apply a first voltage below a limit voltage corresponding to a saturation substrate-source voltage of the parasitic bipolar transistor.

4. The device according to claim 3, wherein the first electrode of the MOS transistor is a drain and the second electrode is a source.

5. The device according to claim 4, wherein the control circuit comprises a resistive element that has a first resistor terminal connected to the source of the MOS transistor and a second resistor terminal connected to the substrate and to the gate of the MOS transistor.

6. The device according to claim 4, wherein the control circuit comprises a first resistive element connected between the source and the substrate of the MOS transistor and a second resistive element connected between the gate and the source of the MOS transistor.

7. The device according to claim 4, wherein the electronic circuitry further comprises a diode having a first anode/cathode connected to the first terminal and a second anode/cathode connected to the second terminal.

8. An electronic device, comprising:
a first terminal;
a second terminal; and
electronic circuitry coupled between the first and second terminals, wherein the electronic circuitry comprises at least one block formed in a substrate and comprising an MOS transistor that has a first electrode, a second electrode, a gate and includes a parasitic bipolar transistor, the MOS transistor having its first electrode coupled to the first terminal, its second electrode coupled to the second terminal and also being configured to, in the presence of a current pulse between the first and second terminals, operate in a hybrid mode including an MOS-type operation in a below-threshold mode and an operation of the parasitic bipolar transistor, wherein the at least one block of the electronic circuitry comprises two cascode-connected blocks.

9. The device according to claim 8, wherein the substrate and the gate of the MOS transistor are connected together, the gate and the substrate of the transistor not being directly connected to one of the first and second terminals.

10. The device according to claim 8, wherein the MOS transistor of each block has its gate connected to its substrate, the substrates of the MOS transistors of each block being connected together, a drain of a first MOS transistor being connected to the first terminal, a source of a second MOS transistor being connected to the second terminal, and a resistive element being connected between the substrate of the second MOS transistor and the second terminal.

11. The device according to claim 8, wherein the device forms a trigger element.

12. An electronic device, comprising:
a first terminal;
a second terminal; and
electronic circuitry coupled between the first and second terminals, wherein the electronic circuitry comprises at least one block formed in a substrate and comprising an MOS transistor that has a first electrode, a second electrode, a gate and includes a parasitic bipolar transistor, the MOS transistor having its first electrode coupled to the first terminal, its second electrode coupled to the second terminal and also being configured to, in the presence of a current pulse between the first and second terminals, operate in a hybrid mode including an MOS-type operation in a below-threshold mode and an operation of the parasitic bipolar transistor, wherein the at least one block of the electronic circuitry comprises first and second identical blocks symmetrically coupled in series between the first terminal and the second terminal.

13. The device according to claim 12, wherein the MOS transistor of the first block has its first electrode coupled to the first terminal via the MOS transistor of the second block and its second electrode coupled to the second terminal, and wherein the MOS transistor of the second block has its first electrode coupled to the first terminal and its second electrode coupled to the second terminal via the MOS transistor of the first block.

14. The device according to claim 13, wherein the MOS transistor of the first block has its gate coupled to its substrate without being coupled to the second terminal and the first block also comprises a resistive element coupled between the substrate of the MOS transistor and the second terminal, and wherein the MOS transistor of the second block has its gate coupled to its substrate without being coupled to the first terminal and the second block also comprises a resistive element coupled between the substrate of the MOS transistor and the first terminal.

15. The device according to claim 13, wherein the electronic circuitry further comprises a triac coupled between the first terminal and the second terminal and having a gate that is coupled to a common connection terminal between the first and second blocks.

16. The device according to claim 15, wherein the triac comprises two fingers respectively produced in an integrated manner within two semiconductive wells, and the first and second blocks are respectively produced in an integrated manner on and within the two semiconductive wells.

17. The device according to claim 12, wherein each block also comprises an additional element configured to delay the discharge of gate capacitance of the MOS transistor.

18. The device according to claim 17, wherein the additional element is connected between the substrate and the gate of the MOS transistor.

19. The device according to claim 18, wherein the additional element is connected between the substrate of the MOS transistor and a resistive element.

20. The device according to claim 18, wherein the additional element comprises a diode having a cathode that is connected to the gate of the MOS transistor.

21. The device according to claim 18, wherein the additional element comprises an additional MOS transistor that has a gate connected to its substrate and one of its other two electrodes connected to the gate of the MOS transistor.

22. The device according to claim 12, wherein the device forms a protection device against electrostatic discharges, the first and the second terminals configured to be connected to a component to be protected.

23. A protection device configured for protecting against electrostatic discharges, the device comprising:
a first terminal;
a second terminal, the first and second terminals configured to be connected to a component to be protected; and
electronic circuitry disposed in a substrate and coupled between the first and second terminals, the electronic circuitry comprising at least one first block comprising an MOS transistor that has a gate coupled to the substrate without being directly coupled to the second terminal, a first electrode of the MOS transistor being coupled to the first terminal, and a second electrode of the MOS transistor being coupled to the second terminal, the electronic circuitry further comprising a first resistive element coupled between the substrate of the MOS transistor and the second terminal, wherein the electronic circuitry further comprises a diode having a first anode/cathode connected to the first terminal and a second anode/cathode connected to the second terminal.

24. The device according to claim 23, wherein the first block comprises a second resistive element connected between the gate and the second terminal.

25. The device according to claim 23, wherein the first electrode of the MOS transistor comprises a drain and the second electrode comprises a source.

26. The device according to claim 23, wherein the first anode/cathode comprises an anode and the second anode/cathode comprises a cathode.

27. The device according to claim 23, wherein the first anode/cathode comprises a cathode and the second anode/cathode comprises an anode.

28. A protection device configured for protecting against electrostatic discharges, the device comprising:
a first terminal;
a second terminal, the first and second terminals configured to be connected to a component to be protected; and
electronic circuitry disposed in a substrate and coupled between the first and second terminals, the electronic circuitry comprising a first block comprising an MOS transistor that has a gate coupled to the substrate without being directly coupled to the second terminal, a first electrode of the MOS transistor being coupled to the first terminal, and a second electrode of the MOS transistor being coupled to the second terminal, the electronic circuitry further comprising a first resistive element coupled between the substrate of the MOS transistor and the second terminal, wherein
the gate of the MOS transistor of the first block is not coupled to the second terminal, and
the electronic circuitry further comprises a second block comprising an MOS transistor that has a gate coupled to a substrate of the transistor without being coupled to the first terminal, a first electrode coupled to the first terminal and a resistive element coupled between the substrate of the transistor and the first terminal, the first electrode of the MOS transistor of the first block being coupled to the first terminal via the MOS transistor of the second block, the MOS transistor of the second block having its second electrode coupled to the second terminal via the MOS transistor of the first block.

29. The device according to claim 28, wherein each block further comprises an additional element configured to delay the discharge of gate capacitance of the MOS transistor.

30. The device according to claim 29, wherein the additional element is connected between the substrate and the gate of the MOS transistor.

31. The device according to claim 29, wherein the additional element is connected between the substrate of the MOS transistor and the corresponding resistive element.

32. The device according to claim 30, wherein the additional element comprises a diode having a cathode connected to the gate of the MOS transistor.

33. The device according to claim 30, wherein the additional element comprises an additional MOS transistor that has a gate connected to its substrate and another electrode connected to the gate of the MOS transistor.

34. The device according to claim 28, wherein the electronic circuitry further comprises a triac coupled between the first terminal and the second terminal, a gate of the triac being coupled to a common connection terminal between the first and second blocks.

35. The device according to claim 34, wherein the triac comprises two fingers respectively implemented in an integrated manner within two semiconductive wells, and the first and second blocks are respectively implemented in an integrated manner on and within the two semiconductive wells.

36. The device according to claim 28, wherein the gate of each MOS transistor has a length that is less than 1 micrometer.

37. An input/output cell of an integrated circuit, comprising:
an input/output pin,
a first power supply terminal,
a second power supply terminal,
a first device coupled between the first power supply terminal and the input/output pin, the first device including first and second terminals and electronic circuitry coupled between the first power supply terminal and the input / output pin, the electronic circuitry comprising at least one block comprising an MOS transistor that has a first electrode, a second electrode, a gate and includes a parasitic bipolar transistor, the MOS transistor having its first electrode coupled to the first power supply terminal, its second electrode coupled to the input/output pin and also being configured to, in the presence of a current pulse between the first power supply terminal and the input/output pin, operate in a hybrid mode including an MOS-type operation in a below-threshold mode and an operation of the parasitic bipolar transistor;
a second device coupled between the input/output pin and the second power supply terminal, the second device including third and fourth terminals and second electronic circuitry coupled between the input/output pin and the second power supply terminal, the second electronic circuitry comprising at least one block comprising an MOS transistor that has a first electrode, a second electrode, a gate and includes a parasitic bipolar transistor, the MOS transistor having its first electrode coupled to the input/output pin, its second electrode coupled to the second power supply terminal and also being configured to, in the presence of a current pulse between the first and second power terminals, operate in a hybrid mode including an MOS-type operation in a below-threshold mode and an operation of the parasitic bipolar-transistor; and
a third device coupled between the first power supply terminal and the second power supply terminal, the third device including fifth and sixth terminals and third electronic circuitry coupled between the first and second power terminals, the third electronic circuitry comprising at least one block comprising an MOS transistor that has a first electrode, a second electrode, a gate and includes a parasitic bipolar transistor, the MOS transistor having its first electrode coupled to the first power supply terminal, its second electrode coupled to the second power supply terminal and also being configured to, in the presence of a current pulse between the first and second power supply terminals, operate in a hybrid mode including an MOS-type operation in a below-threshold mode and an operation of the parasitic bipolar transistor.

38. An integrated circuit comprising at least one input/output cell according to claim 37.

39. A method of protecting a component against electrostatic discharges, wherein at least one MOS transistor is connected between a first terminal and a second terminal of the component, the at least one MOS transistor including a parasitic bipolar transistor, the MOS transistor having a first electrode coupled to the first terminal, a second electrode coupled to the second terminal, the method comprising:
in the presence of an electrostatic discharge between the first and second terminals, activating the MOS transistor to place it in a hybrid mode that includes an MOS-type operation in a below-threshold mode and an operation of the parasitic bipolar transistor, wherein
in the presence of the electrostatic discharge between the first and second terminals, a non-zero first voltage is applied to a substrate of the MOS transistor and a second voltage lower than a threshold voltage is applied to a gate of the MOS transistor, and a first voltage lower than a limit voltage corresponding to a saturation substrate-source voltage of the parasitic bipolar transistor is applied.

* * * * *